(12) United States Patent
Young (10) Patent No.: US 10,224,805 B1
(45) Date of Patent: Mar. 5, 2019

(54) SWITCHED-MODE RIPPLE OPTIMIZATION

(71) Applicant: Alpha and Omega Semiconductor (Cayman) Limited, Grand Cayman (KY)

(72) Inventor: Chris M. Young, Round Rock, TX (US)

(73) Assignee: Alpha and Omega Semiconductor (Cayman) Limited, Grand Cayman (KY)

( * ) Notice: Subject to any disclaimer, the term of this patent is extended or adjusted under 35 U.S.C. 154(b) by 0 days.

(21) Appl. No.: 16/042,878

(22) Filed: Jul. 23, 2018

Related U.S. Application Data (60) Provisional application No. 62/642,717, filed on Mar. 14, 2018.

(51) Int. Cl.
*H02M 1/14* (2006.01)
*H02M 3/158* (2006.01)
*G01R 19/165* (2006.01)

(52) U.S. Cl.
CPC ........ *H02M 1/14* (2013.01); *G01R 19/16528* (2013.01); *G01R 19/16585* (2013.01); *H02M 3/1582* (2013.01); *H02M 3/1584* (2013.01); *H02M 2003/1586* (2013.01)

(58) Field of Classification Search
CPC .......... H02M 1/14; H02M 1/15; H02M 3/158; H02M 3/1582; H02M 3/1584; G05F 1/00; G05F 5/00
See application file for complete search history.

(56) References Cited

U.S. PATENT DOCUMENTS

| | | | |
|---|---|---|---|
| 5,668,708 A * | 9/1997 | Scapellati | H02M 1/14 363/46 |
| 5,929,692 A | 7/1999 | Carsten | |
| 6,495,995 B2 * | 12/2002 | Groom | H02M 3/1584 323/283 |
| 6,522,108 B2 | 2/2003 | Prager et al. | |
| 8,575,910 B2 | 11/2013 | Young | |
| 9,787,189 B1 * | 10/2017 | Lin | H02M 7/217 |
| 2003/0218893 A1 * | 11/2003 | Tai | H02M 3/1584 363/65 |
| 2013/0279216 A1 * | 10/2013 | Nguyen | H02M 1/14 363/41 |
| 2014/0125306 A1 | 5/2014 | Babazadeh et al. | |

* cited by examiner

*Primary Examiner* — Matthew Nguyen
(74) *Attorney, Agent, or Firm* — Craige Thompson; Thompson Patent Law (57) ABSTRACT

Methods and apparatus relate to a minimizing ripple in a polyphase power supply by modulating a voltage pre-regulator output setpoint to minimize ripple performance. In an illustrative example, the modulation may include incrementally adjusting the pre-regulator output setpoint supplied, for example, to a multiphase controller. Some examples may reverse the increment direction in response to determining that the prior incremental adjustment yielded increased ripple. Each phase of the polyphase power supply may include a buck-derived switch-mode power supply connected, for example, to a common output node. Various embodiments may advantageously maximize reduce bulk capacitance requirements for active loads by dynamically seeking a duty cycle of the polyphase power supply with substantially minimal ripple.

20 Claims, 7 Drawing Sheets

SWITCHED-MODE RIPPLE OPTIMIZATION

CROSS-REFERENCE TO RELATED APPLICATIONS

This application claims the benefit of U.S. Provisional Application Ser. No. 62/642,717 titled "Buck-Derived Switching Power Supply Techniques," filed by Chris M. Young on Mar. 14, 2018.

This application incorporates the entire contents of the foregoing application(s) herein by reference.

TECHNICAL FIELD

Various embodiments relate generally to components and methods for switch-mode power supplies.

BACKGROUND

Electronic devices receive power in a variety of ways. For example, consumer electronic devices may receive power from a wall outlet (e.g., mains) or from various portable sources (e.g., batteries, renewable energy sources, generators). Battery operated devices have an operational time that is dependent upon battery capacity and average current draw. Manufacturers of battery powered devices may strive to reduce average battery current of their products in order to offer longer device use between battery replacement or between charge operations. In some examples, manufacturers of main powered devices may strive to increase power efficiency of their products in order to minimize thermal loads and/or to maximize the performance per watt of power consumed.

In some electronic devices, an input voltage supply (e.g., battery input, rectified mains supply, intermediate DC supply) may be converted to a different voltage by various voltage conversion circuits. Switch-mode power supplies have gained popularity as voltage conversion circuits due to their high efficiency and therefore are often used in various electronic devices.

Switch-mode power supplies convert voltages using switching devices that turn on with very low resistance and turn off with very high resistance. Switch-mode power supplies may charge an output inductor during a period of time and may release part or all of the inductor energy during a subsequent period of time. The output energy may be delivered to a bank of output capacitors, which provide the filtering to produce a DC output voltage. In buck-derived switch-mode power supplies, the output voltage, in a steady state, may be approximately the input voltage times a duty cycle, where the duty cycle is the duration of the on-time of a pass switch divided by the total on-time and off-time of the pass switch for one switching cycle.

SUMMARY

Methods and apparatus relate to a minimizing ripple in a polyphase power supply by modulating a voltage pre-regulator output setpoint to minimize ripple performance. In an illustrative example, the modulation may include incrementally adjusting the pre-regulator output setpoint supplied, for example, to a multiphase controller. Some examples may reverse the increment direction in response to determining that the prior incremental adjustment yielded increased ripple. Each phase of the polyphase power supply may include a buck-derived switch-mode power supply connected, for example, to a common output node. Various embodiments may advantageously maximize reduce bulk capacitance requirements for active loads by dynamically seeking a duty cycle of the polyphase power supply with substantially minimal ripple.

Some examples of ripple reducing self-adjusting voltage pre-regulators may substantially reduce the amount of output capacitance required on various buck-derived switch-mode power supplies. Reduction of output capacitance may achieve one or more advantages. For example, capacitance reduction may reduce cost, required board space, weight, assembly cost, assembly time, product reliability and product longevity. Reduced ripple may decrease conducted and/or radiated emissions, which may reduce the amount of required EMI (electromagnetic interference) filtering, which may also reduce development time, product weight, size and cost.

Some examples may increase the efficiency of various switch-mode power supplies. Various embodiments may reduce the amount of output capacitance required on various switch-mode power supplies. Reduction of output capacitance may achieve advantages outlined for the ripple reducing self-adjusting pre-regulator. Various examples may reduce the size, weight, and cost of transient voltage suppression on output voltage supplies of various switch-mode power supplies.

The details of various embodiments are set forth in the accompanying drawings and the description below. Other features and advantages will be apparent from the description and drawings, and from the claims.

DETAILED DESCRIPTION OF ILLUSTRATIVE EMBODIMENTS

To aid understanding, this document is organized as follows. First, a representative computing product is briefly introduced as a dynamic load for a buck-derived DC-DC converter with reference to FIG. 1 to. Second, in FIGS. 2-6F, the discussion turns to various exemplary embodiments that illustrate pre-regulators and methods for reducing ripple current and/or ripple voltage on buck-derived switch-mode power supplies.

Figure 1:
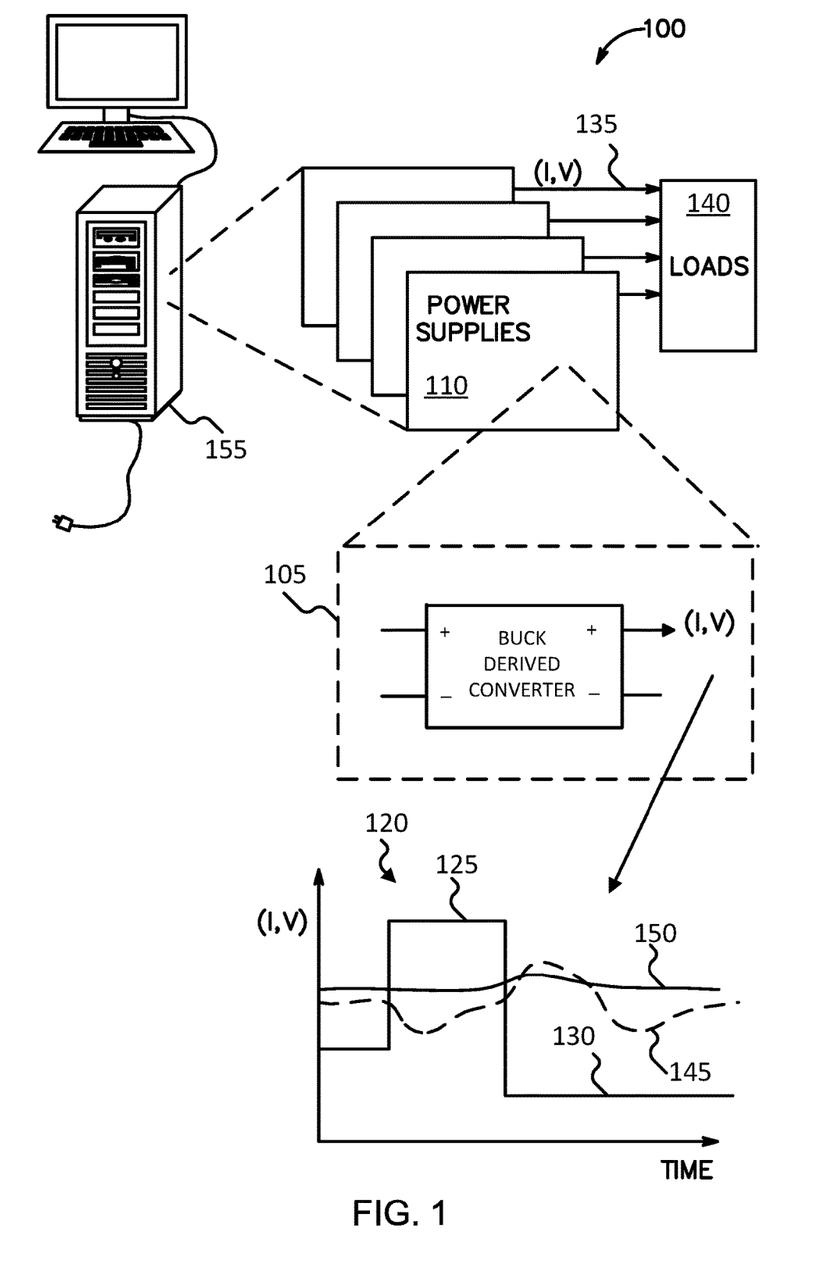
FIG. 1 depicts an exemplary DC-DC conversion scenario illustrating a transient load response in exemplary modes of operation of a buck-derived switch-mode power supply (BPS).

FIG. 1 depicts an exemplary DC-DC conversion scenario illustrating a transient load response in exemplary modes of operation of a buck-derived switch-mode power supply (BPS). A transient load suppression example 100 includes one or more BPS circuits 105, which may be arranged, for example, in a multi-phase power supply system. The BPS circuit 105 is operably coupled to a buck-derived SMPS 110. The BPS circuit 105 may operate in several modes, controlled by an SMPS controller (not shown). For example, a constant on time constant average frequency operation of the BPS 105 may advantageously substantially minimize delay and/or settling time when a load demand 120 changes rapidly, for example, from a high load state 125 to a lower load state 130.

An output voltage supply 135 is supplied by the buck-derived SMPS 110. The output voltage supply 135 supplies various loads 140. The loads 140 may present transient current loading on the output voltage supply 135. As depicted in the exemplary load demand 120 chart, where constant on time operation is not implemented on the buck-derived SMPS 110, the output voltage response 145 may include substantially large perturbations in response to the transient current loading on the output voltage supply 135. When the BPS circuit 105 is implemented on the buck-derived SMPS 110 using an exemplary embodiment of constant on time operation, the output voltage response 150 is substantially well regulated, substantially avoiding the larger voltage perturbations.

In the depicted example, the buck-derived SMPS 110 is implemented in a computer 155. The computer 155 includes one or more buck-derived SMPSs 110 supplying one or more loads 140. In some examples, the loads 140 may be specified to operate at an input voltage with limited voltage perturbations.

Figure 2:
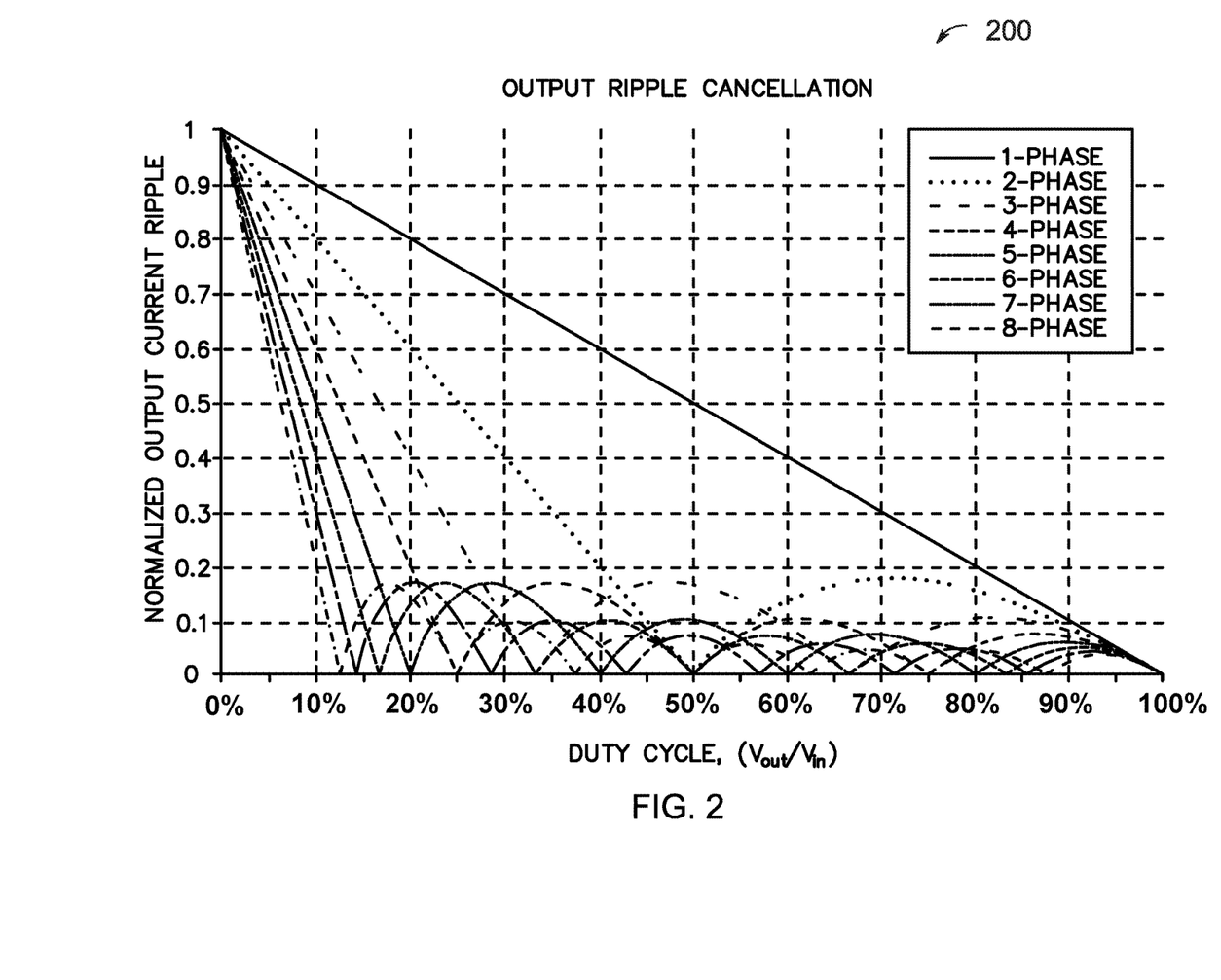
FIG. 2 depicts an exemplary simulated chart view of normalized ripple currents of various multiphase buck-derived switch-mode power supplies (MBPS).

FIG. 2 depicts an exemplary simulated chart view of normalized ripple currents of various multiphase buck-derived switch-mode power supplies (MBPS). A normalized ripple current chart 200 of various MBPS illustrates that an output ripple current is minimized at specific duty cycles associated with a specific number of phases of MBPSs. For example, in a 2-phase BPS, output current ripple may be minimized at 50% duty cycle. In some examples, in a 4-phase BPS, output current ripple may be minimized at 25%, 50% and 75% duty cycle. Since duty cycle, in a buck derived power supply, may be approximated by $V_{out}/V_{in}$, adjusting the input voltage may directly affect the duty cycle, and accordingly, may minimize ripple current.

The minimum output voltage ripple associated with the number of phases in a MBPS may be determined as a function of an output ripple cancellation graph, such as the normalized ripple current chart 200 described with reference to FIG. 2.

Figure 3:
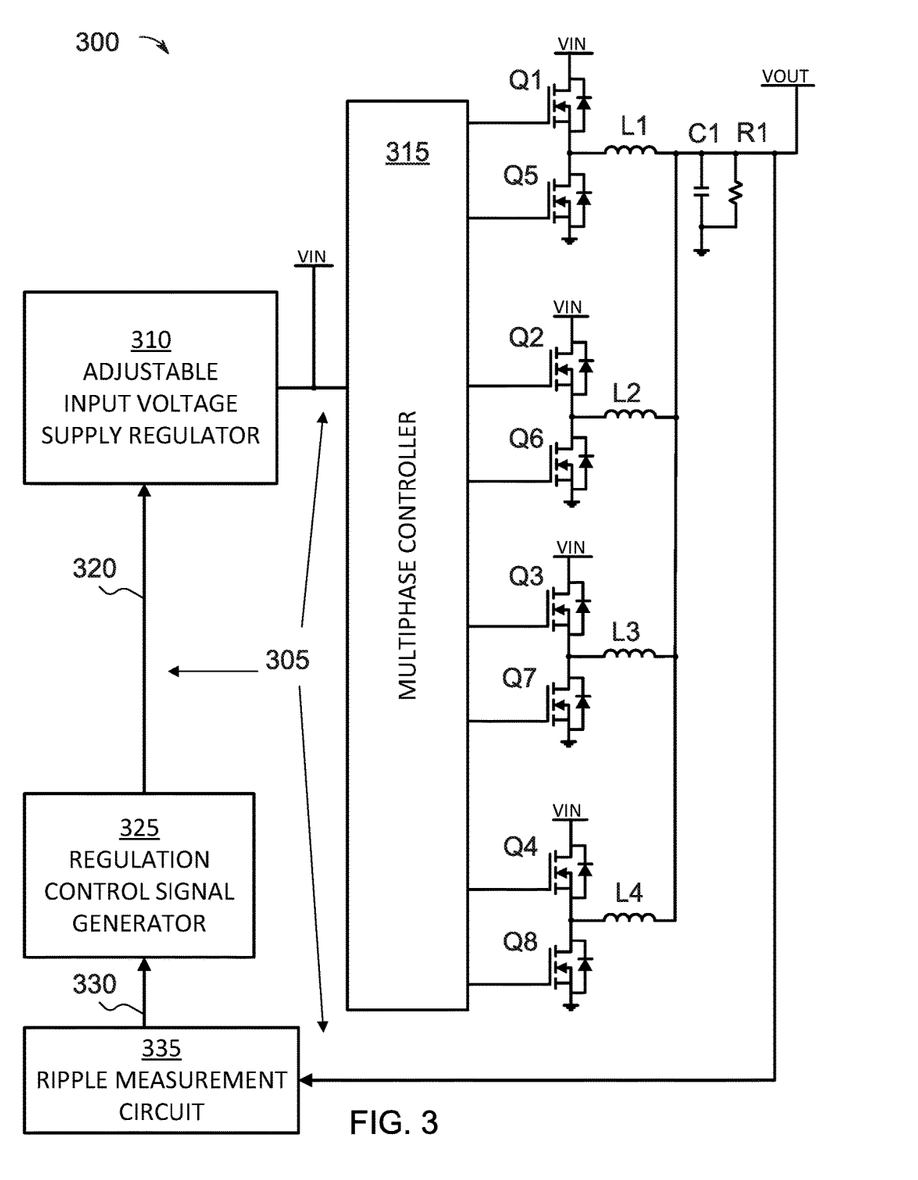
FIG. 3 depicts an exemplary input voltage supply regulator, the regulation point determined by a measured ripple.

FIG. 3 depicts an exemplary input voltage supply regulator, the regulation point determined by a measured ripple. An exemplary four-phase buck-derived power supply 300 includes a regulation feedback loop 305. The regulation feedback loop 305 includes an adjustable input voltage supply regulator 310. The adjustable input voltage supply regulator 310 is configured to generate an input voltage VIN, and to supply power from VIN to a multiphase controller 315 and to switching FETs Q1-Q4.

The adjustable input voltage supply regulator 310 is configured to adjust the input voltage VIN in response to a received control voltage signal 320. A regulation control signal generator 325 is configured to generate the control voltage signal 320 as a function of a received ripple measurement signal 330. A ripple measurement circuit 335 is configured to generate the ripple measurement signal 330 based on a ripple voltage measurement of an output voltage VOUT. In some embodiments, the ripple measurement circuit 335 may be configured to measure the ripple current supplied by the output voltage VOUT. Accordingly, a ripple voltage and/or ripple current may be minimized by modulating an input voltage VIN as a function of a present measured ripple voltage and/or current of an output voltage VOUT.

Although the embodiment depicted in FIG. 3 is a four-phase buck-derived power supply, other embodiments are possible. For example, as depicted in FIG. 2, the buck-derived power supply may include a phase count of 2, 3, 4, 5, 6, 7, or up to at least 36 phases or more. In various examples, the multiphase controller 315 may control the switching FETs of each phase to operate at a duty cycle that produces the minimum output ripple corresponding to the number of phases according to FIG. 2.

Figure 4:
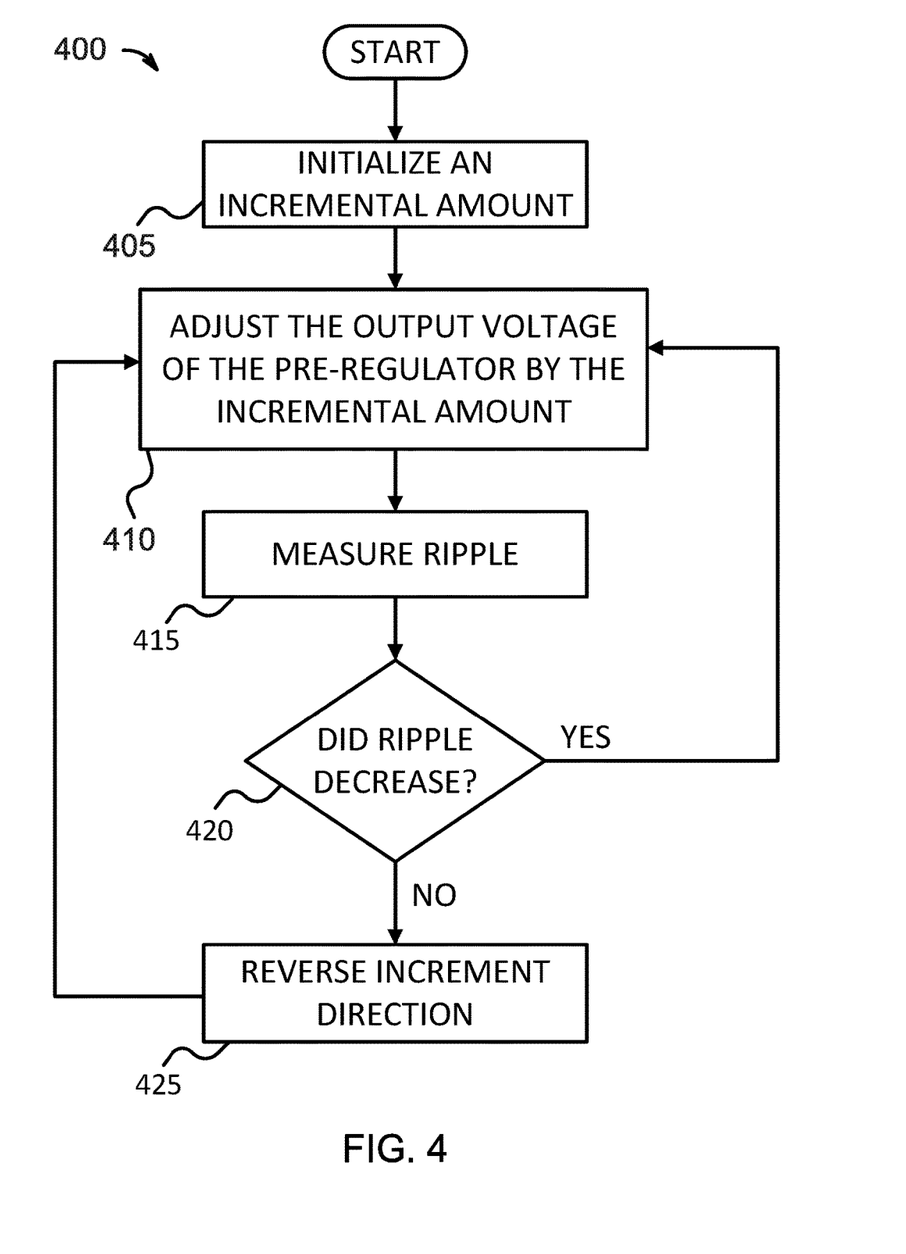
FIG. 4 depicts a flowchart view of an exemplary input voltage regulation control method.

FIG. 4 depicts a flowchart view of an exemplary input voltage regulation control method. An input voltage regulation control method 400 begins at a step 405. At step 405, an incremental amount is initialized. Next, at step 410, an output voltage of a pre-regulator is adjusted by the incremental amount. The pre-regulator may be, for example, with reference to FIG. 3, the adjustable input voltage supply regulator 310. Next, at step 415, a ripple magnitude is measured on an output voltage. The ripple magnitude may be, for example, a ripple voltage and/or a ripple current.

Next, at step 420, the input voltage regulation control method 400 determines a change of the ripple from a previous ripple measurement. When a previous ripple measurement was not yet performed, the previous ripple may be predefined, for example, initialized to zero. If the ripple has decreased in comparison with the previous ripple measurement, then execution jumps back to step 410. If the ripple has increased in comparison with the previous ripple measurement, then execution continues to step 425. At step 425, an increment direction is reversed. Next, execution jumps back to step 410.

The input voltage regulation control method 400 may include, for example, with reference to FIG. 3, the adjustable input voltage supply regulator 310, the regulation control signal generator 325, and the ripple measurement circuit 335.

Figure 5A:
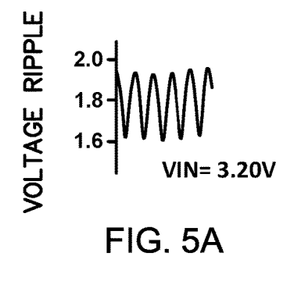
FIGS. 5A, 5B, 5C, 5D, 5E, 5F, and 5G depict measured ripple voltages and ripple currents of an MBPS with an exemplary input voltage regulation control implementation at various input voltages.
Figure 5B:
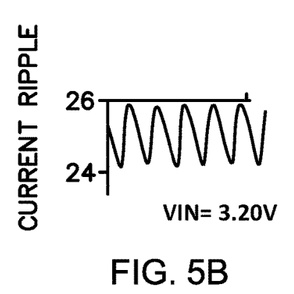
Figure 5C:
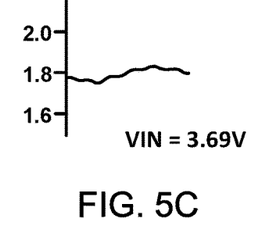
Figure 5D:
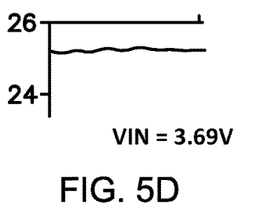
Figure 5E:
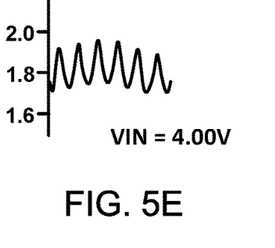
Figure 5F:
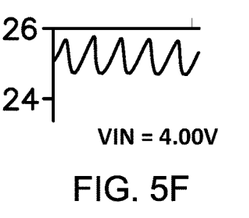
Figure 5G:
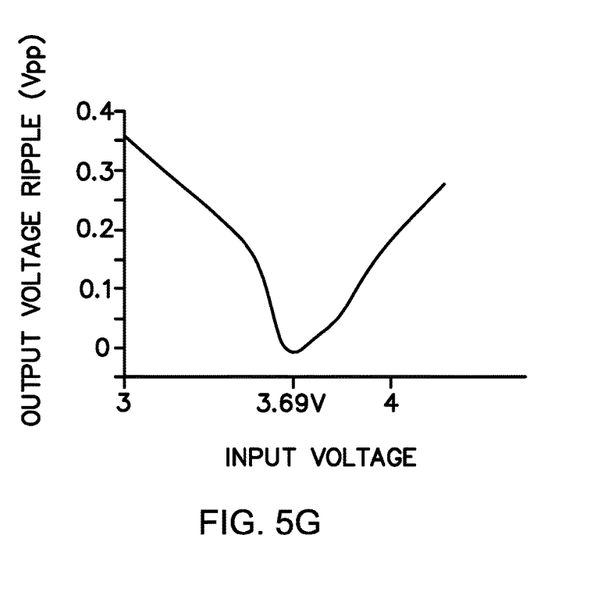

FIGS. 5A, 5B, 5C, 5D, 5E, 5F, and 5G depict measured ripple voltages and ripple currents of an MBPS with an exemplary input voltage regulation control implementation at various input voltages. FIG. 5A depicts the output voltage ripple of an MBPS with an exemplary input voltage regulation control implementation at an input voltage of 3.20 V. FIG. 5B depicts the output current ripple of an MBPS with an exemplary input voltage regulation control implementation at an input voltage of 3.20 V. FIG. 5C depicts the output voltage ripple of an MBPS with an exemplary input voltage regulation control implementation at an input voltage of 3.69 V. FIG. 5D depicts the output current ripple of an MBPS with an exemplary input voltage regulation control implementation at an input voltage of 3.69 V. FIG. 5E depicts the output voltage ripple of an MBPS with an exemplary input voltage regulation control implementation at an input voltage of 4.00 V. FIG. 5F depicts the output current ripple of an MBPS with an exemplary input voltage regulation control implementation at an input voltage of 4.00 V. FIG. 5G depicts a transfer function of the peak-to-peak output voltage ripple of the exemplary input voltage regulation control implementation over a range of input voltages. The input voltage regulation circuit may hunt until it finds the input voltage that provides the lowest output voltage ripple, for example. In the depicted example, the lowest output ripple is achieved with 3.69 V input voltage. In the depicted example, the MBPS is a two phase MBPS and the multiphase controller controls the switching FETs of each phase to operate at a duty cycle of about 50% in order to produce 1.8 V output with minimum output ripple.

Figure 6A:
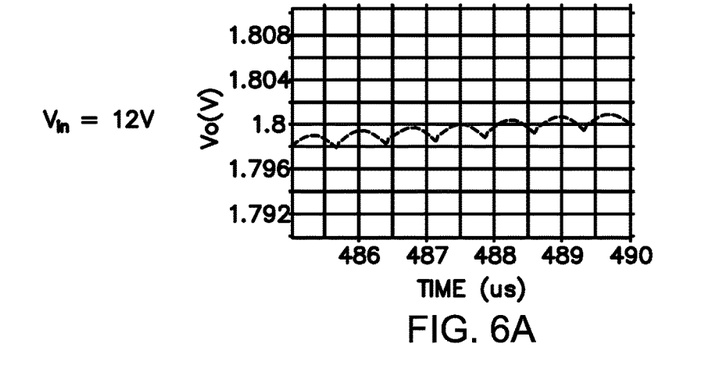
FIGS. 6A, 6B, 6C, 6D, 6E, and 6F depict measured ripple voltages and ripple currents of an MBPS with an exemplary input voltage regulation control implementation at various input voltages.
Figure 6B:
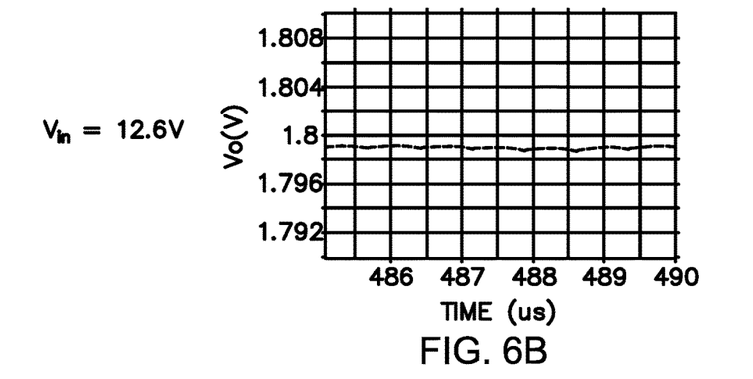
Figure 6C:
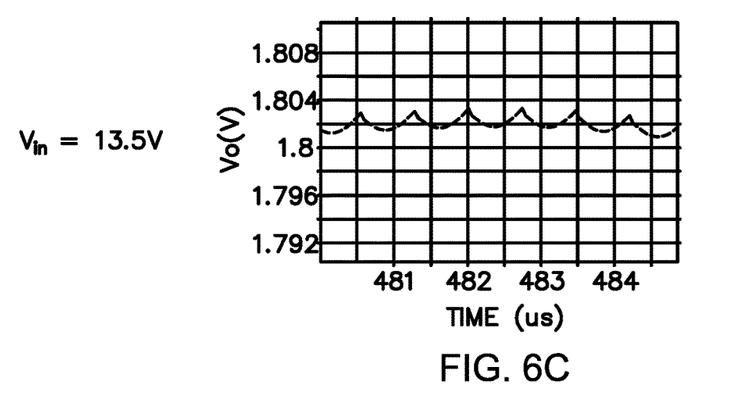
Figure 6D:
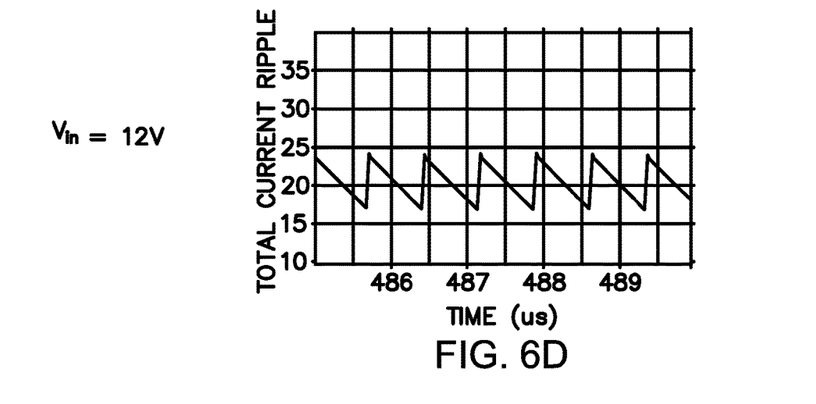
Figure 6E:
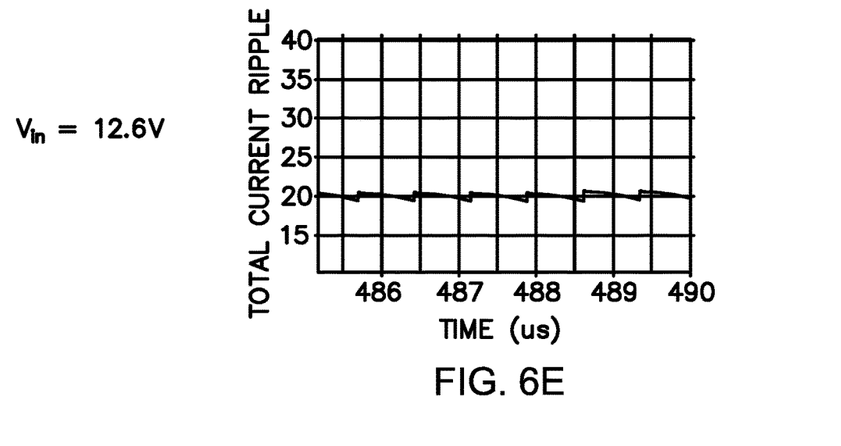
Figure 6F:
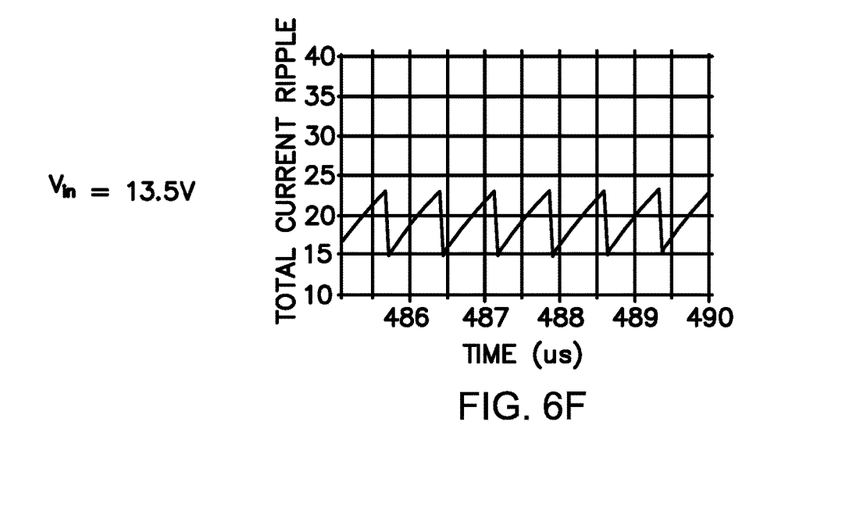

FIGS. 6A, 6B, 6C, 6D, 6E, and 6F depict measured ripple voltages and ripple currents of an MBPS with an exemplary input voltage regulation control implementation at various input voltages. FIG. 6A depicts the output voltage ripple of an MBPS with an exemplary input voltage regulation control implementation at an input voltage of 12.0 V. FIG. 6B depicts the output voltage ripple of an MBPS with an exemplary input voltage regulation control implementation at an input voltage of 12.6 V. FIG. 6C depicts the output voltage ripple of an MBPS with an exemplary input voltage regulation control implementation at an input voltage of 13.5 V. FIG. 6D depicts the output current ripple of an MBPS with an exemplary input voltage regulation control implementation at an input voltage of 12.0 V. FIG. 6E depicts the output current ripple of an MBPS with an exemplary input voltage regulation control implementation at an input voltage of 12.6 V. FIG. 6F depicts the output current ripple of an MBPS with an exemplary input voltage regulation control implementation at an input voltage of 13.5 V.

As presented in FIGS. 6A-6F, various input voltage regulation control implementations may substantially lower ripple voltages and/or ripple currents when an input voltage supply is adjusted to a voltage that provides output ripple cancellation, according to, for example, an exemplary curve of FIG. 2 corresponding to a number of phases for an MBPS implementation. The number of phases shown in FIG. 2 is exemplary only. Power supplies with higher phase numbers were not depicted due to practicality and clarity, however the concepts described may apply without limit to the number of power supply phases.

Although various embodiments have been described with reference to the figures, other embodiments are possible. For example, various freewheeling rectifiers may include synchronous rectifiers, Schottky diodes, high-speed rectifiers, general rectifiers and/or body diodes intrinsic within various transistors (e.g., FETs).

In various implementations, output ripple reduction may be configured according to one or more exemplary aspects. In one exemplary aspect, a voltage pre-regulator may be configured to supply a switch-mode power supply (MP-SMPS) having two or more phases, initializing an incremental amount to a predetermined amount, measuring the output ripple of the MP-SMPS, and iteratively:
  a) adjusting the output voltage of the voltage pre-regulator by the incremental amount,
  b) measuring the output ripple response to the adjustment,
  c) changing the sign of the incremental amount in response to an unimproved output ripple from the previous measurement of MP-SMPS output ripple, (else leaving the incremental amount unchanged), such that the output ripple of the MP-SMPS is minimized.

Some aspects of embodiments may be implemented, in whole or in part, as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a programmable processor; and methods can be performed by a programmable processor executing a program of instructions to perform functions of various embodiments by operating on input data and generating an output. Some embodiments may be implemented advantageously in one or more computer programs that are executable on a programmable system including at least one programmable processor coupled to receive data and instructions from, and to transmit data and instructions to, a data storage system, at least one input device, and/or at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example and not limitation, both general and special purpose microprocessors, which may include a single processor or one of multiple processors of any kind of computer. Generally, a processor will receive instructions and data from a read-only memory or a random-access memory or both. The essential elements of a computer are a processor for executing instructions and one or more memories for storing instructions and data. Storage devices suitable for tangibly embodying computer program instructions and data include all forms of non-volatile memory, including, by way of example, semiconductor memory devices, such as EPROM, EEPROM, and flash memory devices. The processor and the memory can be supplemented by, or incorporated in, ASICs (application-specific integrated circuits). In some embodiments, the processor and the member can be supplemented by, or incorporated in hardware programmable devices, such as FPGAs, for example.

In some implementations, each system may be programmed with the same or similar information and/or initialized with substantially identical information stored in volatile and/or non-volatile memory. For example, one data interface may be configured to perform auto configuration, auto download, and/or auto update functions when coupled to an appropriate host device, such as a desktop computer or a server.

In various implementations, the system may communicate using suitable communication methods, equipment, and techniques. For example, the system may communicate with compatible devices (e.g., devices capable of transferring data to and/or from the system) using point-to-point communication in which a message is transported directly from a source to a first receiver over a dedicated physical link (e.g., fiber optic link, point-to-point wiring, daisy-chain). The components of the system may exchange information by any form or medium of analog or digital data communication, including packet-based messages on a communication network. Examples of communication networks include, e.g., a LAN (local area network), a WAN (wide area network), MAN (metropolitan area network), wireless and/or optical networks, and the computers and networks forming the Internet. Other implementations may transport messages by broadcasting to all or substantially all devices that are coupled together by a communication network, for example, by using omni-directional radio frequency (RF) signals. Still other implementations may transport messages characterized by high directivity, such as RF signals transmitted using directional (i.e., narrow beam) antennas or infrared signals that may optionally be used with focusing optics. Still other implementations are possible using appropriate interfaces and protocols such as, by way of example and not intended to be limiting, USB 2.0, FireWire, ATA/IDE, RS-232, RS-422, RS-485, 802.11 a/b/g/n, Wi-Fi, WiFi- Direct, Li-Fi, BlueTooth, Ethernet, IrDA, FDDI (fiber distributed data interface), token-ring networks, or multiplexing techniques based on frequency, time, or code division. Some implementations may optionally incorporate features such as error checking and correction (ECC) for data integrity, or security measures, such as encryption (e.g., WEP) and password protection.

In various embodiments, a computer system may include non-transitory memory. The memory may be connected to the one or more processors may be configured for encoding data and computer readable instructions, including processor executable program instructions. The data and computer readable instructions may be accessible to the one or more processors. The processor executable program instructions, when executed by the one or more processors, may cause the one or more processors to perform various operations.

In various embodiments, the computer system may include Internet of Things (IoT) devices. IoT devices may include objects embedded with electronics, software, sensors, actuators, and network connectivity which enable these objects to collect and exchange data. IoT devices may be in use with wired or wireless devices by sending data through an interface to another device. IoT devices may collect useful data and then autonomously flow the data between other devices.

In some implementations, the inductor, the main switch, the freewheeling rectifier, the bypass switches, taken alone or in combination, may be disposed within a housing or enclosure. In some implementations, the inductor may be implemented in an integrated circuit. In some embodiments, a discrete (e.g., wound wire) inductor may be packaged with one or more other components in a unitary object, such as by potting. For example, epoxy, elastomer, plastic or other suitable conformable materials may bind or encase the components into a single packaged object. In various implementations, by way of example and not limitation, a housing or enclosure may be formed by dipping, potting, spraying, electrostatic operation, or injection molding.

In various implementations, the output terminal may be adapted to support an output voltage when an output capacitor is connected from the output terminal to the second terminal of the input voltage source. The apparatus may further include an integrated circuit package formed as a unitary body.

The main switch and the freewheeling rectifier may be disposed within the integrated circuit package. The freewheeling rectifier may include a synchronous rectifier, and the second gate drive circuit may be operatively coupled to control the conductivity state of the synchronous rectifier.

In an exemplary aspect, a multi-phase buck-derived power supply system may include a ripple measurement circuit configured to couple to a common node of a multi-phase buck-derived power supply with a multiphase controller adapted to operate a plurality of interleaved switched-mode power supply phases, each of the phases adapted to supply power to the common node. The ripple measurement circuit is configured to monitor the common node for a ripple characteristic. A processor operably couples to the ripple measurement circuit to receive a signal indicative of the monitored ripple characteristic. A data store operably couples to the processor and contains a program of instructions that, when executed by the processor, cause the processor to perform operations to dynamically search for a ripple-optimized pre-regulator setpoint voltage that, when supplied as an input to the plurality of interleaved switched-mode power supply phases, is adapted to minimize the monitored ripple characteristic. The operations may include: (i) determine an initial value of the monitored ripple characteristic and a direction; (ii) adjust the pre-regulator setpoint voltage by an incremental amount in the direction; (iii) determine an adjusted value of the monitored ripple characteristic after the adjustment in step (ii); and, (iv) if the adjusted value improves the ripple characteristic, then repeat step (ii).

In various embodiments, the operations may further include if the adjusted value worsens the ripple characteristic, then reverse the direction and repeat step (ii).

The monitored ripple characteristic comprises a ripple voltage on the common node. The monitored ripple characteristic comprises a ripple current supplied to a load via the common node.

The system may further include the multiphase controller operably coupled to the ripple measurement circuit. The system may further include a voltage pre-regulator operably coupled to supply the pre-regulator setpoint voltage to the multiphase controller.

In various embodiments, the multiphase controller is operably coupled to supply the pre-regulator setpoint voltage command to the voltage pre-regulator.

The system may further include a communication bus adapted to communicate the pre-regulator setpoint voltage command from the multiphase controller to the voltage pre-regulator.

The system may further include at least one analog signal line adapted to communicate the pre-regulator setpoint voltage command from the multiphase controller to the voltage pre-regulator.

In various embodiments, the plurality of interleaved switched-mode power supply phases may include two or more phases.

The system may further include at least one switching transistor in each of the phases, wherein the multiphase controller is configured to control each of the at least one switching transistors in each of the phases to operate at a duty cycle corresponding substantially to a minimum output ripple voltage associated with the number of phases in the two or more phases.

The plurality of interleaved switched-mode power supply phases may include two or more phases, such as, for example, between two and 8 phases, 6 phases, and more than 8 phases.

In some embodiments, a multiphase controller may be operably coupled to the ripple measurement circuit. The multiphase controller may be operably coupled to supply the pre-regulator setpoint voltage command to the voltage pre-regulator. Various implementations may also include a communication bus adapted to communicate the pre-regulator setpoint voltage command from the multiphase controller to the voltage pre-regulator. Some embodiments may include at least one analog signal line adapted to communicate the pre-regulator setpoint voltage command from the multiphase controller to the voltage pre-regulator. The analog signal line adapted to communicate the pre-regulator setpoint voltage command from the multiphase controller to the voltage pre-regulator may be, for example, a two wire signal line. By way of example, and not limitation, the communication bus or analog signal line(s) may, for example, be formed at least in part in a conductive track on a printed circuit board (PCB) or a backplane.

The interleaved switched-mode power supply phases may include two or more phases, such as, for example 15, 18, 24, 27, or 36. Some embodiments may include at least one switching transistor (e.g., BJT, FET, IGBT, etc. . . . ) in each of the phases, wherein the multiphase controller may be configured to control each of the at least one switching transistors in each of the phases to operate at a duty cycle corresponding substantially to a minimum output ripple voltage associated with the number of phases in the two or more phases. The minimum output voltage associated with the number of phases may be determined as a function of the output ripple cancellation graph, described with reference to FIG. 2.

In another exemplary aspect, a method for operating a multi-phase buck-derived power supply system includes monitoring the common node for a ripple characteristic. The monitoring may be done with a ripple measurement circuit configured to couple to a common node of a multi-phase buck-derived power supply with a multiphase controller adapted to operate a plurality of interleaved switched-mode power supply phases. Each of the phases is adapted to supply power to the common node. The method further includes receiving, with a processor operably coupled to the ripple measurement circuit, a signal indicative of the monitored ripple characteristic. The method further includes providing a data store operably coupled to the processor and containing a program of instructions that, when executed by the processor, cause the processor to perform operations to dynamically search for a ripple-optimized pre-regulator setpoint voltage that, when supplied as an input to the plurality of interleaved switched-mode power supply phases, is adapted to minimize the monitored ripple characteristic, the operations comprising: (i) determine an initial value of the monitored ripple characteristic and a direction; (ii) adjust the pre-regulator setpoint voltage by an incremental amount in the direction; (iii) determine an adjusted value of the monitored ripple characteristic after the adjustment in step (ii); and, if the adjusted value improves the ripple characteristic, then repeat step (ii).

A number of implementations have been described. Nevertheless, it will be understood that various modifications may be made. For example, advantageous results may be achieved if the steps of the disclosed techniques were performed in a different sequence, or if components of the disclosed systems were combined in a different manner, or if the components were supplemented with other components. Accordingly, other implementations are contemplated within the scope of the following claims.

What is claimed is:

1. A multi-phase buck-derived power supply system, the system comprising:
   a ripple measurement circuit configured to couple to a common node of a multi-phase buck-derived power supply with a multiphase controller adapted to operate a plurality of interleaved switched-mode power supply phases, each of the phases adapted to supply power to the common node, the ripple measurement circuit being configured to monitor the common node for a ripple characteristic;
   a processor operably coupled to the ripple measurement circuit to receive a signal indicative of the monitored ripple characteristic;
   a data store operably coupled to the processor and containing a program of instructions that, when executed by the processor, cause the processor to perform operations to dynamically search for a ripple-optimized pre-regulator setpoint voltage that, when supplied as an input to the plurality of interleaved switched-mode power supply phases, is adapted to minimize the monitored ripple characteristic, the operations comprising:
   (i) determine an initial value of the monitored ripple characteristic and a direction;
   (ii) adjust the pre-regulator setpoint voltage by an incremental amount in the direction;
   (iii) determine an adjusted value of the monitored ripple characteristic after the adjustment in step (ii); and,
   (iv) if the adjusted value improves the ripple characteristic, then repeat step (ii).

2. The system of claim 1, wherein the operations further comprise:
   (v) if the adjusted value worsens the ripple characteristic, then reverse the direction and repeat step (ii).

3. The system of claim 1, wherein the monitored ripple characteristic comprises a ripple voltage on the common node.

4. The system of claim 1, wherein the monitored ripple characteristic comprises a ripple current supplied to a load via the common node.

5. The system of claim 1, further comprising the multiphase controller operably coupled to the ripple measurement circuit.

6. The system of claim 5, wherein the multiphase controller is operably coupled to supply the pre-regulator setpoint voltage command to the voltage pre-regulator.

7. The system of claim 6, further comprising a communication bus adapted to communicate the pre-regulator setpoint voltage command from the multiphase controller to the voltage pre-regulator.

8. The system of claim 6, further comprising at least one analog signal line adapted to communicate the pre-regulator setpoint voltage command from the multiphase controller to the voltage pre-regulator.

9. The system of claim 1, wherein the plurality of interleaved switched-mode power supply phases comprises two or more phases.

10. The system of claim 1, further comprising at least one switching transistor in each of the phases, wherein the multiphase controller is configured to control each of the at least one switching transistors in each of the phases to operate at a duty cycle corresponding substantially to a minimum output ripple voltage associated with the number of phases in the two or more phases.

11. A method for operating a multi-phase buck-derived power supply system, the method comprising:
   monitoring, with a ripple measurement circuit configured to couple to a common node of a multi-phase buck-derived power supply with a multiphase controller adapted to operate a plurality of interleaved switched-mode power supply phases, each of the phases adapted to supply power to the common node, the common node for a ripple characteristic;
   receiving, with a processor operably coupled to the ripple measurement circuit, a signal indicative of the monitored ripple characteristic;
   providing a data store operably coupled to the processor and containing a program of instructions that, when executed by the processor, cause the processor to perform operations to dynamically search for a ripple-optimized pre-regulator setpoint voltage that, when supplied as an input to the plurality of interleaved switched-mode power supply phases, is adapted to minimize the monitored ripple characteristic, the operations comprising:
   (i) determine an initial value of the monitored ripple characteristic and a direction;
   (ii) adjust the pre-regulator setpoint voltage by an incremental amount in the direction;
   (iii) determine an adjusted value of the monitored ripple characteristic after the adjustment in step (ii); and, (iv) if the adjusted value improves the ripple characteristic, then repeat step (ii).

12. The method of claim 11, wherein the operations further comprise:
(v) if the adjusted value worsens the ripple characteristic, then reverse the direction and repeat step (ii).

13. The method of claim 11, wherein the monitored ripple characteristic comprises a ripple voltage on the common node.

14. The method of claim 11, wherein the monitored ripple characteristic comprises a ripple current supplied to a load via the common node.

15. The method of claim 11, further comprising the multiphase controller operably coupled to the ripple measurement circuit.

16. The method of claim 15, further comprising a voltage pre-regulator operably coupled to supply the pre-regulator setpoint voltage to the multiphase controller.

17. The method of claim 11, wherein the plurality of interleaved switched-mode power supply phases comprises between two and 8 phases.

18. The method of claim 11, wherein the plurality of interleaved switched-mode power supply phases comprises two or more phases.

19. The method of claim 11, wherein the plurality of interleaved switched-mode power supply phases comprises 6 phases.

20. The method of claim 11, wherein the plurality of interleaved switched-mode power supply phases comprises more than 8 phases.

* * * * *